United States Patent
Rowland et al.

(10) Patent No.: US 7,391,058 B2
(45) Date of Patent: Jun. 24, 2008

(54) SEMICONDUCTOR DEVICES AND METHODS OF MAKING SAME

(75) Inventors: Larry Burton Rowland, Scotia, NY (US); Ahmed Elasser, Latham, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/168,174

(22) Filed: Jun. 27, 2005

(65) Prior Publication Data

US 2006/0289873 A1      Dec. 28, 2006

(51) Int. Cl.
*H01L 29/15* (2006.01)
*H01L 31/0312* (2006.01)

(52) U.S. Cl. .......................... 257/77; 257/183; 257/197; 257/472; 257/475; 257/617; 257/E29.104

(58) Field of Classification Search .................. None
See application file for complete search history.

(56) References Cited

U.S. PATENT DOCUMENTS

| | | | |
|---|---|---|---|
| 6,488,771 B1 | 12/2002 | Powell et al. | 117/89 |
| 6,515,313 B1 | 2/2003 | Ibbetson et al. | 257/103 |
| 6,849,874 B2 | 2/2005 | Sumakeris et al. | 257/77 |
| 2003/0165697 A1* | 9/2003 | Saitoh et al. | 428/446 |
| 2004/0164380 A1* | 8/2004 | Nagasawa | 257/617 |
| 2005/0064723 A1 | 3/2005 | Sumakeris | 438/757 |

FOREIGN PATENT DOCUMENTS

| EP | 1427021 A1 | 9/2004 |
|---|---|---|
| WO | WO 03/027363 A1 | 3/2003 |

OTHER PUBLICATIONS

H. Lendenmann, F. Dahlquist, N. Johansson, R. So derholm, P. A. Nilsson, J. P. Bergman, and P. Skytt, "Long Term Operation of 4.5kV PiN and 2.5kV JBS Diodes", Mater. Sci. Forum 353-356, pp. 727-730 (2001).

* cited by examiner

*Primary Examiner*—Minh-Loan Tran
*Assistant Examiner*—Leslie Pilar Cruz
(74) *Attorney, Agent, or Firm*—Fletcher Yoder

(57) ABSTRACT

A composite structure having a silicon carbide epitaxial layer is provided. The epitaxial layer includes at least four regions arranged vertically and defining respective interfaces, where each of the regions is characterized by a respective impurity concentration, where the impurity concentrations vary across each of the interfaces, and where each of the impurity concentrations exceeds $1\times10^{17}$ $cm^{-3}$ for at least one single impurity in all of the regions.

24 Claims, 3 Drawing Sheets

SEMICONDUCTOR DEVICES AND METHODS OF MAKING SAME

BACKGROUND

The invention relates generally to semiconductor devices having improved reliability. In particular, the invention relates to reducing the defects in semiconductor materials employed in bipolar semiconductor devices.

Silicon carbide is often employed in various semiconductor applications such as electronic devices, including bipolar devices. Silicon carbide has a wide bandgap, a high breakdown electric field, a high thermal conductivity, and a high-saturated electron drift velocity, which makes it a desirable candidate for use in semiconductor devices. Moreover, it is technologically feasible to grow large crystals of silicon carbide to be used in various electronic applications. Also, silicon carbide is a physically robust material that has a high melting point.

However, because of its physical properties, silicon carbide is also relatively difficult to produce. For example, silicon carbide exists in various crystal structures, also known as polytypes. As will be appreciated, there are as many as 150 polytypes of silicon carbide. These polytypes are formed by different stacking orders of the silicon carbide layers in the crystal structure and are separated by relatively small thermodynamic differences. Therefore, these polytypes may be formed by a slight temperature variation during the manufacturing process. Hence, growing single crystal substrates and high quality epitaxial layers in silicon carbide has been, and remains, a difficult task.

Moreover, it has been observed that the performance of the silicon carbide devices tend to degrade upon prolonged use. In particular, forward voltage under forward bias tends to increase with time in bipolar junction devices. This effect is also known as bipolar degradation. As will be appreciated, the term "bipolar" refers to any device in which operation is achieved at least partially by means of minority carrier injection such that the conduction through some region of the device is accomplished using both electrons and holes as carriers simultaneously, or a device in which, during forward conduction, there is at least one forward biased p-n junction. The increase in forward voltage in bipolar devices is generally attributed to crystal defects such as stacking faults bound by edge dislocations. Under forward bias, the stacking faults tend to progress, in process causing the forward voltage to increase.

Further, leakage current caused by screw dislocations also adds to the performance degradation of the bipolar devices. Screw dislocations are the primary cause of high leakage current. As will be appreciated, high leakage current lowers the signal to noise ratio, thereby limiting the use of silicon carbide devices.

Although a number of advances have been made in the growth of silicon carbide and its use in devices, it is desirable to further minimize the defects in silicon carbide to make it a viable choice for commercial products. Accordingly, there exists a need for a silicon carbide substrate having a relatively low defect density, which can be processed at low cost and employed in a semiconductor device.

BRIEF DESCRIPTION

In accordance with one aspect of the present technique, a composite structure having a silicon carbide epitaxial layer is provided. The epitaxial layer includes at least four regions arranged vertically and defining respective interfaces, where each of the regions is characterized by a respective impurity concentration. The impurity concentrations vary across each of the interfaces, and each of the impurity concentrations exceeds $1 \times 10^{17}$ cm$^{-3}$ for at least one single impurity in all of the regions.

In accordance with another aspect of the present technique, a method of manufacturing a composite structure is provided. The method includes growing a silicon carbide epitaxial layer on a silicon carbide substrate, where the step of growing includes growing a first plurality of regions and a second plurality of regions, which are alternately arranged vertically. The first plurality of regions is grown under a first set of growth conditions, and the second plurality of regions is grown under a second set of growth conditions, where the first set of growth conditions differs from the second set of growth conditions.

In accordance with another aspect of the present technique, a composite structure having a silicon carbide epitaxial layer is provided. The epitaxial layer includes a plurality of regions arranged vertically, where each of the regions is characterized by a reduction in dominant defect type during the epitaxial growth of the region, and where the dominant defect types vary for neighboring regions.

DRAWINGS

These and other features, aspects, and advantages of the present invention will become better understood when the following detailed description is read with reference to the accompanying drawings in which like characters represent like parts throughout the drawings, wherein.

Figure 3:
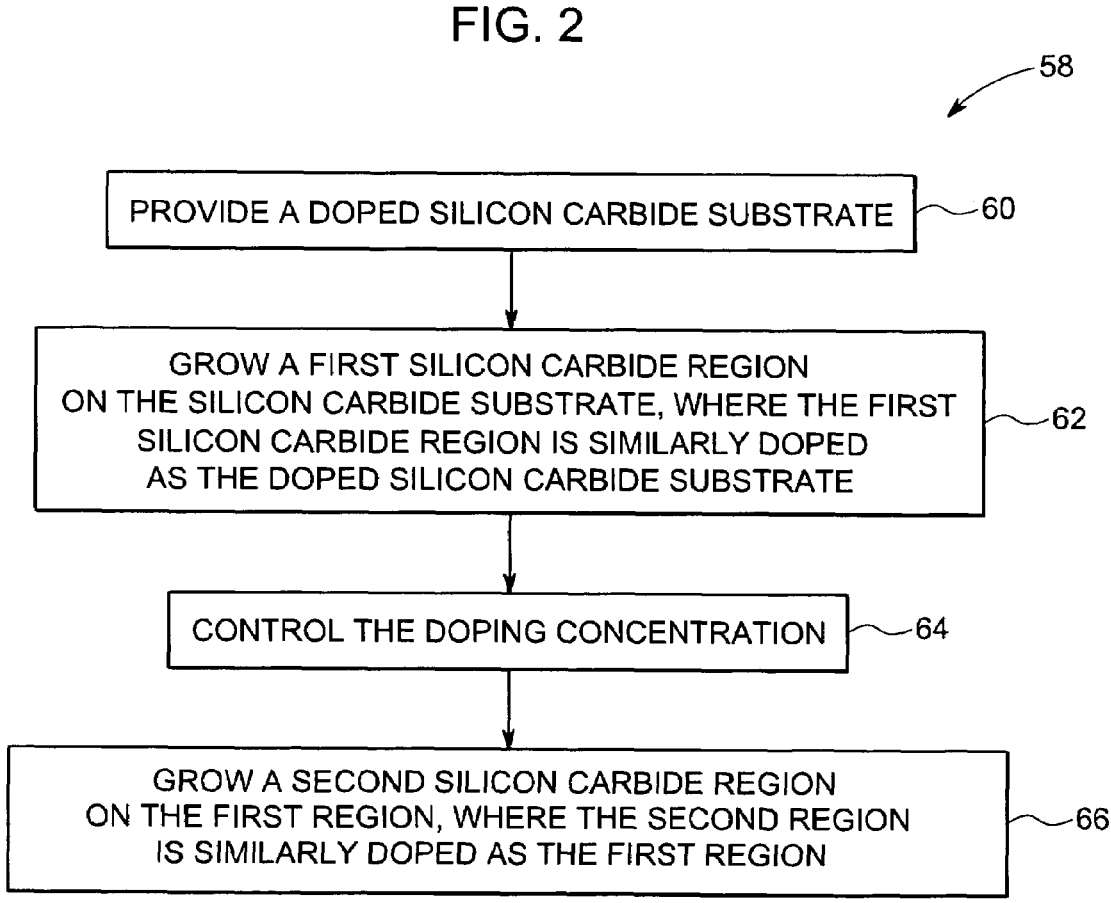
Figure 4:
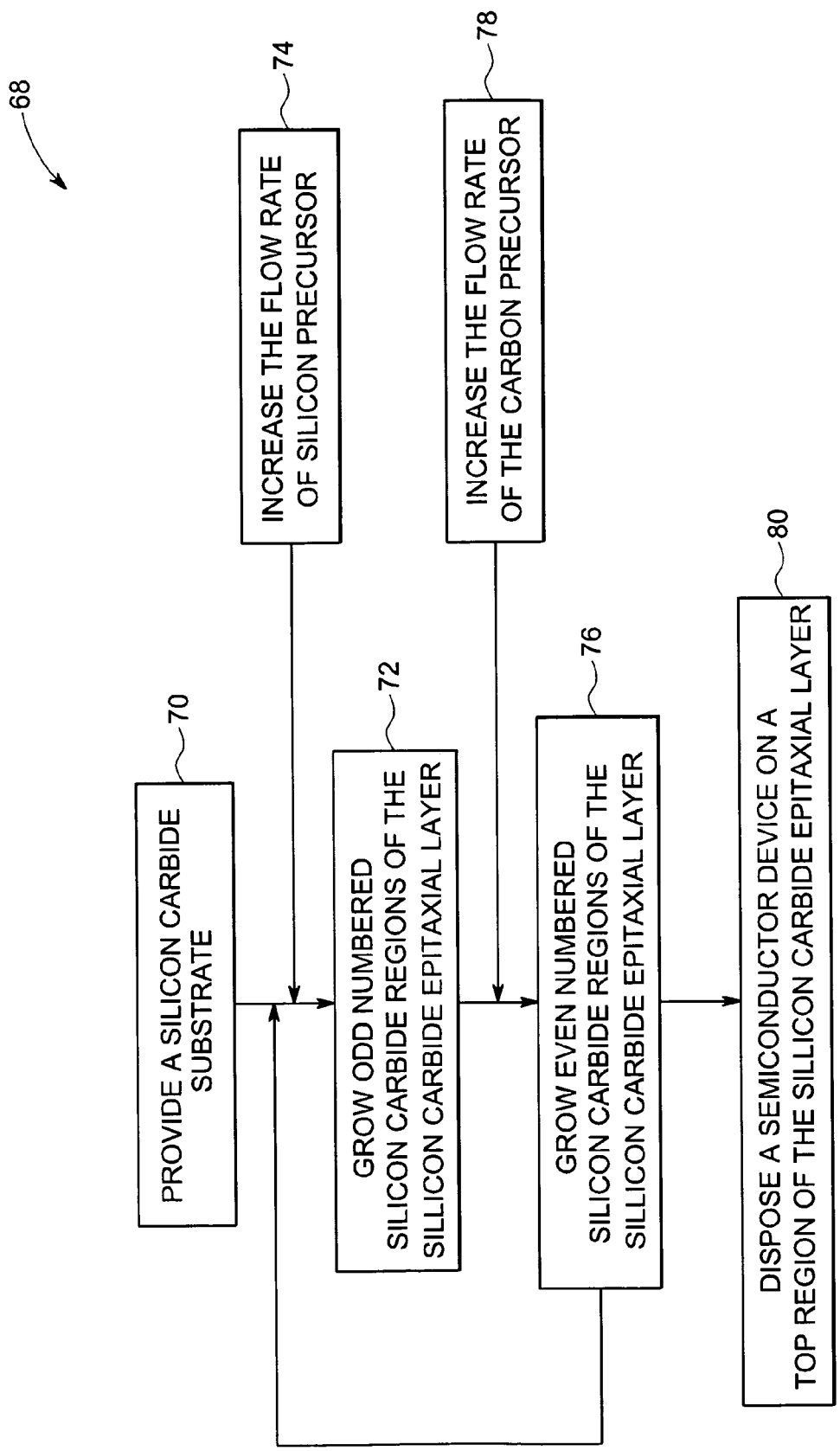

FIG. 3 is a flow chart illustrating another exemplary process of manufacturing a composite structure on a silicon carbide substrate, in accordance with certain embodiments of the present technique; and FIG. 4 is a flow chart illustrating still another exemplary process of manufacturing a composite structure on a silicon carbide substrate, in accordance with certain embodiments of the present technique.

DETAILED DESCRIPTION

Semiconductor materials, such as silicon carbide, are implemented in various electronic devices. Advantageously, silicon carbide has a wide band gap, a high breakdown electric field, a high thermal conductivity, and a high saturated electron drift velocity, which makes it a desirable candidate for use in semiconductor devices. Also, silicon carbide is a physically robust material that has a high melting point.

However, the silicon carbide substrates may have some inherent structural defects, such as micropipes or dislocations. As will be appreciated, the line imperfections in a crystal structure are generally referred to as "dislocations." Further, as will be appreciated, a Burgers circuit is a symmetrical path followed from atom to atom in a crystal that returns to its starting point. However, if the same path in the lattice of the structure does not return to the starting point, the vector that closes such a path is referred to as "Burgers vector." Hence, Burgers vector characterizes a dislocation line and represents the magnitude and direction of the displacement. If Burgers vector is parallel to the line that locates the dislocation, the defect if referred to as a screw "dislocation." Whereas, when the Burgers vector is perpendicular to the dislocation, the defect is referred to as an "edge dislocation." Silicon carbide substrates usually include both screw and edge dislocations. These dislocations can be further grouped by their alignment within the crystal. In the case of the hexagonal or rhombohedral polytypes of silicon carbide, the dislocations propagating along the (0001) plane are called "basal plane dislocations" and those perpendicular to the (0001) plane are called "threading dislocations." Each of these dislocations may adversely affect the device performance, but it is the basal plane dislocations that are generally most associated with the bipolar degradation.

Bipolar degradation is mostly attributed to the growth of planar defects such as stacking faults under the application of forward current in a bipolar device. In other words, the passage of electric current in a silicon carbide bipolar device tends to initiate or facilitate a change in crystal structure. When the stacking faults progress too extensively, they tend to cause the forward current to increase in an undesirable manner, thereby preventing the device from operating in a reliable manner. In semiconductor devices grown on silicon carbide substrates having dislocations, the defects in the substrate are transferred or replicated onto the device. These defects then increase the reverse leakage current and may also cause premature or catastrophic breakdown of the device.

As described in detail below, in certain embodiments, the Burgers vectors of dislocations may be altered while growing a respective region of the epitaxial layer on the substrate to prevent the dislocations present in the substrate from continuing in the adjoining region of the epitaxial layer. For example, by changing the Burgers vector of the edge dislocations, the stacking faults may be prevented from being transferred to the adjoining epitaxial layer. In these embodiments, the dislocation density in the adjoining layer is less than the former layer.

Figure 1:
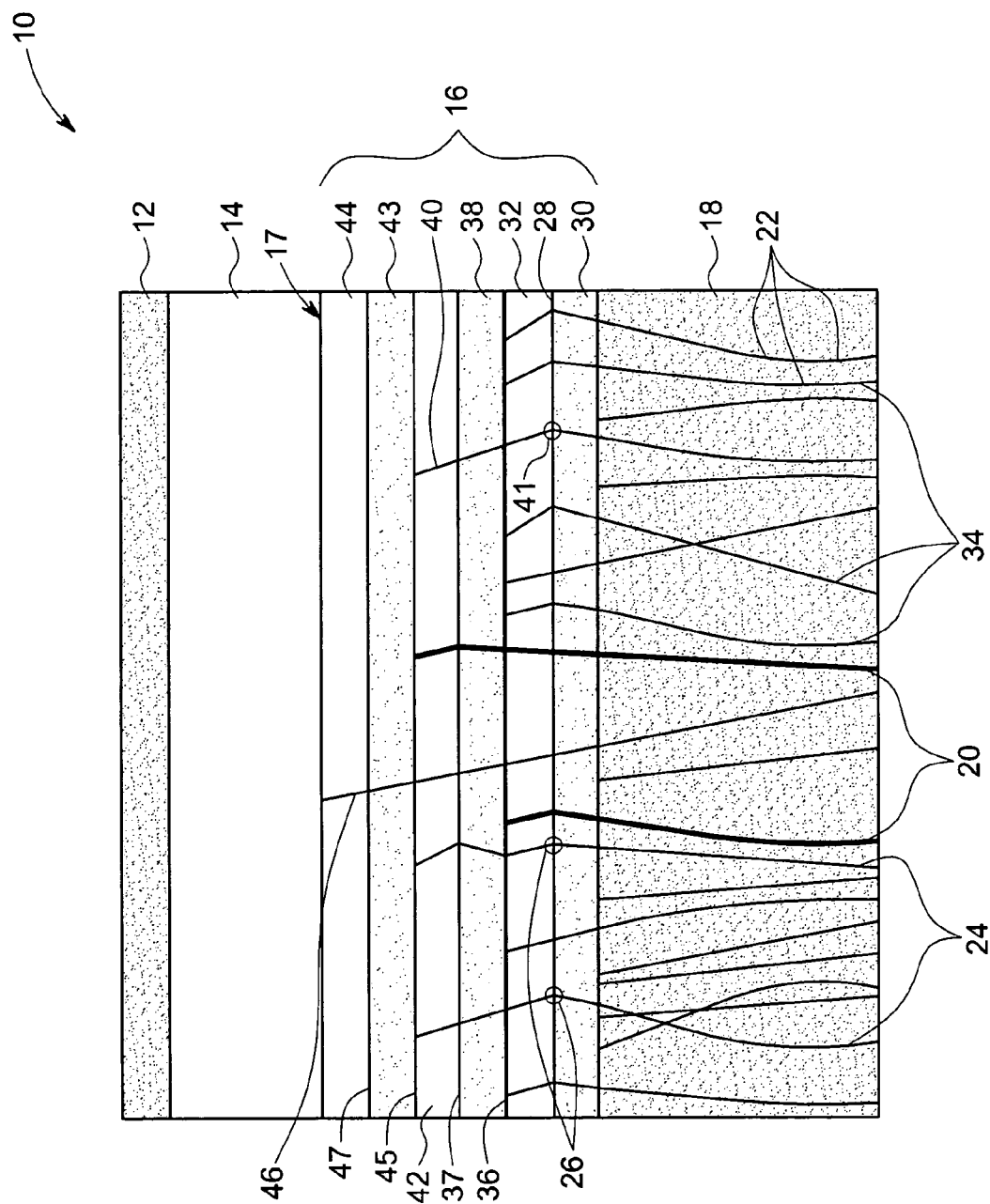
FIG. 1 is a cross sectional side view illustrating a composite structure including a silicon carbide epitaxial layer having at least four regions arranged vertically and defining respective interfaces, in accordance with certain embodiments of the present technique.

Referring to FIG. 1, a cross sectional side view of an exemplary semiconductor structure 10 employing semiconductor device layers 12 and 14 is shown. In some embodiments, the device layers 12 and 14 may include a Schottky diode, a bipolar diode, a bipolar junction transistor, a metal semiconductor oxide field effect transistor, a metal semiconductor field effect transistor, a junction field effect transistor, a thyristor, a gate turn off thyristor, a photodiode, an avalanche photodiode, a static induction transistor, an insulated gate bipolar transistor, or an IMPATT diode, or combinations thereof In the illustrated embodiment, the device layers 12 and 14 are disposed on a composite structure 16. The composite structure 16 may also be referred to as a "buffer layer". In certain embodiments, the composite structure 16 includes a silicon carbide epitaxial layer, such as an epitaxial layer 17. Further, in some embodiments, the epitaxial layer 17 includes at least four regions, such as regions 30, 32, 38, 42, 43 and 44, arranged vertically and defining respective interfaces 28, 36, 37, 45 and 47. Alternatively, in some embodiments, the silicon carbide epitaxial layer 17 includes a plurality of regions arranged vertically, where each of the regions is characterized by a reduction in dominant defect type during the epitaxial growth of the region, and where the dominant defect types vary for neighboring regions.

In the illustrated embodiment, the epitaxial layer 17 having the plurality of regions is disposed or grown on a substrate 18. As illustrated by representative lines, the substrate 18 may include various structural defects such as, micropipes 20 (represented by bold lines) and dislocations 22 (represented by thin lines). As will be appreciated, the epitaxial layer 17 of the composite structure 16 may have a lesser or greater number of regions than shown in the embodiment of FIG. 1.

As described in detail below, in certain embodiments, the dislocations, such as dislocations 22, 24, 34 may be dominant defect types. In other words, the density of the dislocations in the epitaxial layer 17 may be substantially more than the density of any other defects, such as micropipes. In these embodiments, the dislocations 22 may bend or terminate at interfaces of any two regions due to change in deposition conditions of the regions, thereby reducing the defect density in the subsequent regions. As illustrated in the embodiment of FIG. 1, the dislocations, such as dislocations 24 may develop bends 26 at the junction 28 formed between the regions 30 and 32. Accordingly, in some embodiments, one or more regions, such as regions, 30, 32, 38, 42, 43 and 44 may be deposited on the substrate 18 while varying the deposition conditions/parameters such that the successive regions have a lower defect density. In other words, each of the regions of the epitaxial layer 17 is characterized by a reduction in one or more of the dominant defect types during the epitaxial growth of the region. In these embodiments, moving from the substrate 18 towards the device layers 12 and 14, the dislocation densities or defect densities in the regions continue to decrease. Consequently, the region employing the device layers has the minimum dislocation density as represented by the lesser number of lines in the top regions of the composite structure 16.

As described in detail below, in some embodiments, instead of bending the dislocations, the dislocations may be confined to a region by changing the stress fields around the dislocations. In this way, these dislocations and defects which are confined to a region will not see electric fields that would either cause reverse leakage or bipolar degradation. For example, dislocations, such as dislocations 34 terminate at interface 36 formed between the regions 32 and 38 due to change in deposition conditions.

In an exemplary embodiment, the composite structure 16 may include a first region 30 having a first defect density and a second region 32 disposed on the first region 30 and having a second defect density. In these embodiments, the second defect density is lower than the first defect density. Further, in some embodiments, a third region, such as a region 38 may be disposed on the second region 32. In these embodiments, the third region 38 has a third defect density, where the third defect density is lower than the second defect density. As described, in some embodiments, the first region 30 is grown under a first set of growth conditions and the second region 32 is grown under a second set of growth conditions, different than the first, such that the defect density can be reduced for each subsequent region.

In the illustrated embodiment of FIG. 1, the top region 44, i.e., the region employing the device layer 14, has a relatively lower defect density as compared to the other regions of the composite structure 16. As illustrated in FIG. 1, top region 44 only has a single defect (i.e., dislocation 46). As will be appreciated, in this embodiment, the defect density of the regions of the composite structure 16 decreases in the direction from the substrate 18 to the device layers 12 and 14. For example, in the illustrated embodiment, the region 38 has a lower defect density as compared to the region 32, which in turn has a lower defect density as compared to the layer 30. In some embodiments, the reduction in defect density of the region 44, or the region employing the device layer 14 may range from about 2 folds to about 100 folds. In another embodiment, the reduction in the defect density of the region 44 may range from about 10 folds to about 100 folds. In other words, the defect density of the epitaxial layer 17 is lower in a respective one of the regions neighboring the semiconductor device layers 12 and 14 than in a respective one of the regions neighboring the substrate 18.

However, as illustrated, some dislocations may remain unaffected by the alterations in the deposition conditions. For example, although, the dislocation 40 develops a bend 41 at junction 28 due to change in Burgers vector, the dislocation 40 remains unaffected by the changes occurring between regions 32 and 38 and also between 38 and 42. Similarly, the dislocation 46 remains unaffected by any changes made in the growth conditions or compositions during the course of growing the composite structure, and thus extends through each of the regions 30, 32, 38, 42, 43 and 44.

Figure 2:
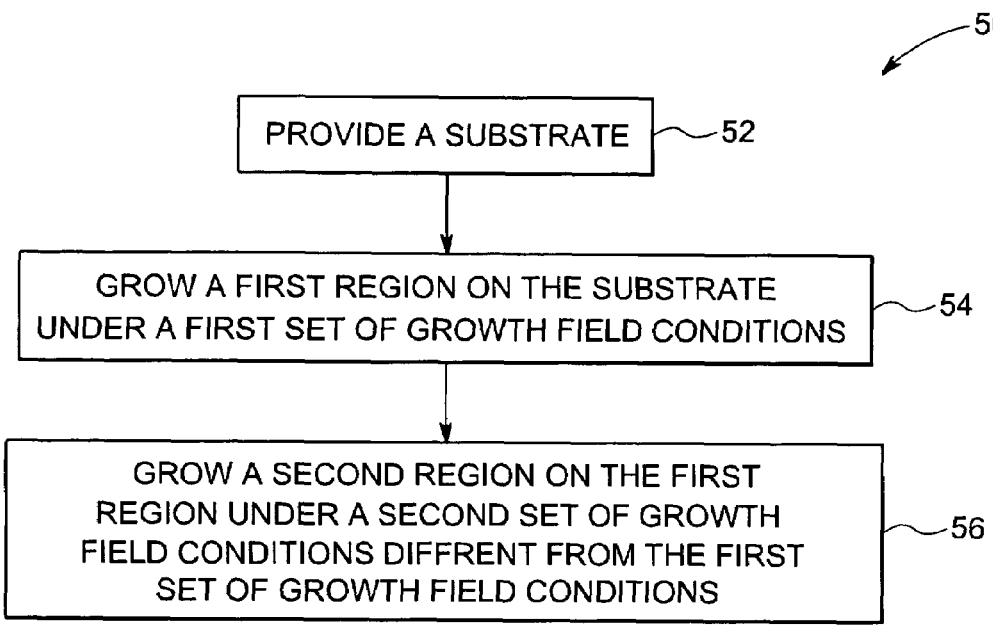
FIG. 2 is a flow chart illustrating an exemplary process of manufacturing a composite structure on a semiconductor substrate, in accordance with certain embodiments of the present technique.

FIG. 2 illustrates a process 50 for forming a composite structure on a semiconductor substrate. At block 52, a substrate, such as a silicon carbide substrate 18 is provided. At block 54, a first region is grown on a substrate under a first set of growth conditions. At block 56, a second region is grown on the first region. In these embodiments, the second region is grown under a second set of growth conditions, which are different from the first set of growth conditions. As will be appreciated, different kinds of dislocations grow under different kinds of growth conditions. Accordingly, in certain embodiments, the growth of certain kinds of dislocations, such as threading and basal dislocations may be inhibited by systematically varying these growth conditions during the deposition of these regions. For example, in some embodiments, the growth rate of the dislocations may be altered by varying deposition parameters such as composition, doping concentration, temperature, or pressure, or combinations thereof. In these embodiments, systematic changes in growth conditions of the regions from those that promote vertical growth to those that promote lateral growth may allow dislocations to propagate only along the plane perpendicular to the growth axis, thereby inhibiting the growth of dislocations through the regions.

For example, in one embodiment, the first set of growth conditions include a first dopant concentration and the second set of growth conditions include a second dopant concentration, such that the second dopant concentration is different from the first dopant concentration. In another embodiment, one of the first and second sets of growth conditions is selected to promote vertical growth, and the other of the first and second sets of growth conditions is selected to promote lateral growth. In some embodiments, the growth conditions may include compositional conditions, such as carbon-to-silicon ratio, dopant concentration, concentration of impurities, and various deposition parameters such as temperature and pressure. As will be appreciated, by varying the deposition parameters such as the concentration and composition of the precursor gases, such as carbon-containing gases for silicon carbide substrates, the lateral growth element may be altered. Consequently, in these embodiments, the different regions of the composite structure 16 may have variable compositions.

Similarly, in some embodiments, the composite structure 16 may include a first region 30 having a first material and a second region 32 disposed on the first region and comprising a second material. In these embodiments, the first material may include material grown under a relatively high flow of carbon-containing precursors, and the second material may include material grown under a relatively low flow of carbon-containing precursors. Likewise, in some embodiments, the composite structure 16 may include a first plurality of regions (e.g., regions 30, 38 and 43) comprising a first concentration of elements and a second plurality of regions comprising a second concentration of elements different from the first concentration of elements (e.g., 32, 42 and 44), such that the second plurality of regions are alternately arranged between the first plurality of regions.

Alternatively, in some embodiments, the first set of growth conditions includes a first temperature and the second set of growth conditions includes a second temperature, such that the second temperature is different from the first temperature. Likewise, in other embodiments, the first set of growth conditions includes a first pressure and the second set of growth conditions includes a second pressure, such that the second pressure is different from the first pressure. Further, in some embodiments, the first set of growth conditions comprises a first dopant concentration of about $1 \times 10^{17}$ cm$^{-3}$ to about $5 \times 10^{18}$ cm$^{-3}$, and the second set of growth conditions includes a second dopant concentration in a range of about $8 \times 10^{18}$ cm$^{-3}$ to about $5 \times 10^{20}$ cm$^{-3}$.

FIG. 3 illustrates a process 58 for forming a composite structure 16 (see FIG. 1) on a doped silicon carbide substrate. In the illustrated embodiment, a doped silicon carbide substrate, such as substrate 18 (FIG. 1), is provided (block 60). At block 62, a first similarly doped region of silicon carbide is grown on the substrate 18. As used herein, the term "similarly doped" refers to the same doping type and is not an indication of a level of doping concentration. For example, in one embodiment, a n-doped region is grown on a n-doped substrate 18. Alternatively, in another embodiment, a p-doped region is grown on a p-doped substrate 18.

In certain embodiments, each region of the composite structure 16 may have the same doping type. Additionally, in some of these embodiments, the doping type of the regions of the composite structure 16 may be similar to the doping type of the substrate 18 employing the composite structure 16 and the device layer 14 disposed on the composite structure 18. Advantageously, formation of a p-n junction is prevented inside the composite structure or between the composite structure 16 and the substrate 18 or between the composite structure 16 and the device layer 14 by having the same doping type.

Further, at block 64, the doping concentration also referred to as impurity concentration, of the dopant is controlled in the precursor material. Next, at block 66, a second silicon carbide region is grown on the first region, such that the second region is similarly doped as the first region and the substrate. However, the doping concentration of the first and second regions is different. In one embodiment, the doping concentration of the second region is higher than the first region. As will be appreciated, the doping concentrations may also be controlled in-situ while growing the first or second regions. Additionally, more regions like first and second regions may be grown subsequent to the deposition of the second region.

Moreover, in certain embodiments, each of the impurity concentrations exceeds $1 \times 10^{17}$ cm$^{-3}$ for at least one single impurity. In these embodiments, the impurity concentrations correspond to a concentration of an impurity ion, such as aluminum, boron, gallium, phosphorus, oxygen, nitrogen, vanadium, titanium, germanium, or combinations thereof. In an exemplary embodiment, where nitrogen is employed as an impurity ion, the nitrogen concentration exceeds $1 \times 10^{17}$ cm$^{-3}$ in all the regions of the epitaxial layer 17. Further, in some embodiments, the silicon carbide epitaxial layer 17 is n-doped, i.e., each region of the epitaxial layer 17 is n-doped. In some of these embodiments, the impurity ion may include nitrogen, phosphorus, or both. Further, in these embodiments, the epitaxial layer 17 has a thickness of at least about 0.1 micron. In an alternative embodiment, the silicon carbide epitaxial layer 17 is p-doped, in other words, each region of the epitaxial layer 17 is p-doped. In some of these embodiments, the impurity ion may include aluminum, gallium, boron, or combinations thereof. Further, in these embodiments, the epitaxial layer 17 has a thickness of at least about 0.1 micron.

In an exemplary embodiment, some of the plurality of regions of the composite structure may be delta doped. As will be appreciated, delta doping is the kind of doping which includes introducing a dopant in a high doping concentration in at least one region of the plurality of regions. Such abrupt changes in a region build a stress field that suppresses the growth of dislocations. In an experiment employing an exemplary embodiment, several regions of the composite structure 16 were grown while altering the doping concentration in a series of doping spikes. In some embodiments, the doping concentration in the doping spikes may range from about $10^{18}$ $cm^{-3}$ to about $10^{20}$ $cm^{-3}$. In other embodiments, the doping concentration in the doping spikes may range from about $10^{19}$ $cm^{-3}$ to about $10^{20}$ $cm^{-3}$. In these embodiments, the stress field caused by each of these doping spikes served to filter out dislocations that may cause bipolar degradation and reverse leakage current in the device.

In some embodiments, at least two regions separated by a common third region have impurity concentrations that differ by less than a factor of two. For example, in one embodiment, the impurity concentration of regions 30 and 38 that are separated by a common third region 32 may be about $1.1\times 10^{18}$ $cm^{-3}$ and about $7\times 10^{17}$ $cm^{-3}$, respectively. Alternatively, in some embodiments, the epitaxial layer 17 may include a first plurality of regions and a second plurality of regions, which are characterized by a first and a second impurity concentration, and which are alternately arranged. In an exemplary embodiment, the epitaxial layer 17 includes five or more regions arranged vertically and defining respective interfaces. In another exemplary embodiment, the silicon carbide epitaxial layer 17 is one of n-type or p-type doped. In this embodiment, the regions belonging to the second plurality of regions have at least a factor of five higher concentrations of dopants than do the regions belonging to the first plurality of regions. In an exemplary embodiment, the doping concentration of a region of the second plurality of regions is approximately ten times higher than the doping concentration of the adjoining region of the first plurality of regions. Additionally, the regions belonging to the second plurality of regions are thinner than the regions belonging to the first plurality of regions. In an exemplary embodiment, the regions belonging to the second plurality of regions have a thickness of less than about 0.02 microns, whereas the regions belonging to the first plurality of regions have a thickness of at least about 0.05 microns.

In an alternate embodiment, thickness of the delta doped regions may range from about 0.2 to about 5 microns. In an exemplary embodiment, the thickness of the delta doped region is about 1 micron. In this embodiment, ten doping spikes are formed at a distance of 1 nm along the thickness of the region. Stresses generated by delta doping facilitate filtering of the dislocations that cause bipolar degradation and reverse leakage current. As will be appreciated, delta doping may either be n-type or p-type.

Referring to FIG. 4, a process 68 for forming a composite structure on a silicon carbide substrate is illustrated. In this embodiment, a plurality of regions of silicon carbide is deposited on a silicon carbide substrate. In these embodiments, the composition of the precursor material is cyclically changed to alternately deposit silicon-rich and carbon-rich regions. As will be appreciated, by this cyclical variation of precursor material concentrations, the dislocations favored under a particular composition will not transfer to the next layer which is grown under different growth conditions.

At block 70, a silicon carbide substrate, such as substrate 18 (see FIG. 1) is provided. At block 72, a first region of the first plurality of regions, or the odd numbered regions, such as regions 30, 38, and 43 (see FIG. 1) is grown under a relatively low flow of carbon-containing precursors (block 74) in the precursor mixture. Accordingly, the first plurality of regions is made under silicon-rich conditions. At block 76, a first region of the second plurality of regions, or the even numbered regions, such as regions 32, 42, and 44 (see FIG. 1) is grown on the first region of the first plurality of regions. At block 78, the flow rate of carbon is increased while growing the second plurality of regions under carbon rich conditions. In these embodiments, the lateral growth component between any pair of regions is varied to bend the dislocations or filter those which are most deleterious.

As with carbon- and silicon-containing precursor concentrations, deposition parameters such as temperature and pressure may also be varied while growing the regions so as to alter the growth conditions. Steps 72, 74, 76 and 78 are repeated such that the first plurality of regions (30, 38 and 43) are alternately grown between the second plurality of regions (32, 42 and 44) to form the composite structure 16 having stacked regions with alternately different properties.

Next, at block 80, a semiconductor device, such as device layers 12 and 14 (see FIG. 1) is disposed on the top region of the composite structure 16 (see FIG. 1). In an exemplary embodiment, the device layers 12 and 14 may include different silicon carbide polytypes, such as 3C, 4H, 6H, 15R, 2H, 8H, or 21R—SiC.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A composite structure comprising a silicon carbide epitaxial layer having at least four regions arranged vertically and defining respective interfaces, wherein each of the regions is characterized by a respective impurity concentration, wherein the impurity concentrations vary across each of the interfaces from one region to an adjacent region, and wherein each of the impurity concentrations exceeds $1\times10^{17}$ $cm^{-3}$ for at least one single impurity in all of the regions, and wherein the silicon carbide epitaxial layer has a thickness of at least about 0.1 micron.

2. A composite structure comprising a silicon carbide epitaxial layer having at least four regions arranged vertically and defining respective interfaces, wherein each of the regions is characterized by a respective impurity concentration, wherein the impurity concentrations vary across each of the interfaces from one region to an adjacent region, and wherein each of the impurity concentrations exceeds $1\times10^{17}$ $cm^{-3}$ for at least one single impurity in all of the regions; and wherein at least two of the regions separated by a common third region have impurity concentrations that differ by greater than a factor of one.

3. The composite structure of claim 2, wherein each of the impurity concentrations corresponds to a concentration of an impurity ion, the impurity ion comprising aluminum, boron, gallium, phosphorus, oxygen, nitrogen, vanadium, titanium, germanium, or combinations thereof.

4. The composite structure of claim 3, wherein the silicon carbide epitaxial layer is n-type doped using nitrogen, phosphorus, or both at an atomic concentration of at least about $1 \times 10^{17}$ cm$^{-3}$, and wherein the silicon carbide epitaxial layer has a thickness of at least about 0.1 micron.

5. The composite structure of claim 3, wherein the silicon carbide epitaxial layer is p-type doped using aluminum, gallium, boron, or combinations thereof at an atomic concentration of at least about $1 \times 10^{17}$ cm$^{-3}$, and wherein the silicon carbide epitaxial layer has a thickness of at least about 0.1 micron.

6. The composite structure of claim 2, further comprising a substrate, wherein the silicon carbide epitaxial layer is disposed over the substrate and forms a buffer layer.

7. The composite structure of claim 6, further comprising a semiconductor device disposed over the buffer layer.

8. The composite structure of claim 7, wherein the semiconductor device comprises a Schottky diode, a bipolar diode, a bipolar junction transistor, a metal semiconductor oxide field effect transistor, a metal semiconductor field effect transistor, a junction field effect transistor, a thyristor, a gate turn off thyristor, a photodiode, an avalanche photodiode, a static induction transistor, an insulated gate bipolar transistor, an JMPATT diode, and combinations thereof.

9. The composite structure of claim 7, wherein a defect density of the buffer layer is lower in a respective one of the regions neighboring the semiconductor device than in a respective one of the regions neighboring the substrate.

10. A composite structure comprising a silicon carbide epitaxial layer having at least four regions arranged vertically and defining respective interfaces, wherein each of the regions is characterized by a respective impurity concentration, wherein the impurity concentrations vary across each of the interfaces from one region to an adjacent region, and wherein each of the impurity concentrations exceeds $1 \times 10^{17}$ cm$^{-3}$ for at least one single impurity in all of the regions; and wherein the regions comprise a first plurality of regions and a second plurality of regions, which are characterized respectively by a first and a second impurity concentration, and which are alternately arranged, wherein the silicon carbide epitaxial layer is p-type doped, and wherein the regions belonging to the second plurality of regions have at least a factor of five higher concentration of p-type dopants than do the regions belonging to said first plurality of regions.

11. The composite structure of claim 10, wherein the regions belonging to the second plurality of regions are thinner than the regions belonging to the first plurality of regions.

12. A composite structure comprising a silicon carbide epitaxial layer having at least four regions arranged vertically and defining respective interfaces, wherein each of the regions is characterized by a respective impurity concentration, wherein the impurity concentrations vary across each of the interfaces from one region to an adjacent region, and wherein each of the impurity concentrations exceeds $1 \times 10^{17}$ cm$^{-3}$ for at least one single impurity in all of the regions, and wherein the regions comprise a first plurality of regions and a second plurality of regions, which are characterized respectively by a first and a second impurity concentration, and which are alternately arranged, and wherein the silicon carbide epitaxial layer is n-type doped, and wherein the regions belonging to the second plurality of regions have at least a factor of five higher concentration of n-type dopants than do the regions belonging to the first plurality of regions.

13. The composite structure of claim 12, wherein at least two of the regions separated by a common third region have impurity concentrations that differ by greater than a factor of one.

14. The composite structure of claim 1, wherein the silicon carbide epitaxial layer comprises at least five of the regions arranged vertically and defining respective interfaces.

15. The composite structure of claim 12, wherein the regions belonging to the second plurality of regions are thinner than the regions belonging to the first plurality of regions.

16. The composite structure of claim 12, wherein each of the impurity concentrations coITesponds to a concentration of an impurity ion, the impurity ion comprising, phosphorus, oxygen, nitrogen, vanadium, titanium, germanium, or combinations thereof.

17. The composite structure of claim 16, wherein the silicon carbide epitaxial layer is n-type doped using nitrogen, phosphorus, or both at an atomic concentration of at least about $1 \times 10^{17}$ cm$^{-3}$, and wherein the silicon carbide epitaxial layer has a thickness of at least about 0.1 micron.

18. The composite structure of claim 12, further comprising a substrate, wherein the silicon carbide epitaxial layer is disposed over the substrate and forms a buffer layer.

19. The composite structure of claim 18, further comprising a semiconductor device disposed over the buffer layer.

20. The composite structure of claim 19, wherein the semiconductor device comprises a Schottky diode, a bipolar diode, a bipolar junction transistor, a metal semiconductor oxide field effect transistor, a metal semiconductor field effect transistor, a junction field effect transistor, a thyristor, a gate turn off thyristor, a photodiode, an avalanche photodiode, a static induction transistor, an insulated gate bipolar transistor, an IMPATT diode, and combinations thereof.

21. The composite structure of claim 19, wherein a defect density of the buffer layer is lower in a respective one of the regions neighboring the semiconductor device than in a respective one of the regions neighboring the substrate.

22. A composite structure comprising a silicon carbide epitaxial layer having a plurality of regions arranged vertically, wherein each of the regions is characterized by a reduction in dominant defect type during the epitaxial growth of the region, and wherein the dominant defect types vary for neighboring regions.

23. The composite structure of claim 22, wherein the regions comprise a first plurality of regions and a second plurality of regions, which are alternately arranged, wherein the first and second pluralities of regions are characterized by a first and a second dominant defect type, respectively, and wherein the first and second dominant defect types are different.

24. The composite structure of claim 22, further comprising:
a substrate, wherein the silicon carbide epitaxial layer is disposed over the substrate and forms a buffer layer; and
a semiconductor device disposed over the buffer layer, wherein a defect density of the silicon carbide epitaxial layer is lower in a respective one of the regions neighboring the semiconductor device than in a respective one of the regions neighboring the substrate.

* * * * *

UNITED STATES PATENT AND TRADEMARK OFFICE
CERTIFICATE OF CORRECTION

PATENT NO.         : 7,391,058 B2                                            Page 1 of 1
APPLICATION NO. : 11/168174
DATED              : June 24, 2008
INVENTOR(S)        : Rowland et al.

It is certified that error appears in the above-identified patent and that said Letters Patent is hereby corrected as shown below:

In Column 9, Line 21, in Claim 8, delete "JMPATT" and insert -- IMPATT --, therefor.

In Column 10, Line 5, in Claim 14, delete "claim 1," and insert -- claim 12, --, therefor.

In Column 10, Line 12, in Claim 16, delete "colTesponds" and insert -- corresponds --, therefor.

Signed and Sealed this

Twenty-third Day of November, 2010

David J. Kappos
*Director of the United States Patent and Trademark Office*